United States Patent
Kim et al.

(10) Patent No.: US 9,103,863 B2
(45) Date of Patent: Aug. 11, 2015

(54) METHOD AND APPARATUS FOR MEASURING A LOCATION OF A TERMINAL USING MAGNETIC FIELD

(75) Inventors: Eung Sun Kim, Suwon-si (KR); Do Hyung Park, Seoul (KR); Yong Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 324 days.

(21) Appl. No.: 13/600,776

(22) Filed: Aug. 31, 2012

(65) Prior Publication Data

US 2013/0057260 A1 Mar. 7, 2013

(30) Foreign Application Priority Data

Sep. 2, 2011 (KR) ........................ 10-2011-0088796

(51) Int. Cl.
| | |
|---|---|
| G01B 7/04 | (2006.01) |
| G01R 33/00 | (2006.01) |
| G01R 1/00 | (2006.01) |
| G01R 33/12 | (2006.01) |
| G01B 1/00 | (2006.01) |
| G06T 1/00 | (2006.01) |

(52) U.S. Cl.
CPC .............. *G01R 33/0064* (2013.01); *G01R 1/00* (2013.01); *G01R 33/1207* (2013.01); *G01B 1/00* (2013.01); *G06T 1/00* (2013.01)

(58) Field of Classification Search
CPC ........ G01R 1/00; G01B 1/00; G01B 2210/00; G01B 2290/00; G06T 1/00; G06T 2200/00; G06T 2201/00; H04W 4/00; G21H 1/00

USPC ............ 324/207.11, 242, 243, 244, 245, 246, 324/247, 260, 754.29, 76.13, 76.19, 76.21, 324/76.46, 114, 115

See application file for complete search history.

(56) References Cited

U.S. PATENT DOCUMENTS

| | | | | |
|---|---|---|---|---|
| 4,731,581 | A * | 3/1988 | Doriath et al. | 324/244.1 |
| 5,437,276 | A * | 8/1995 | Takada | 600/409 |
| 5,642,045 | A * | 6/1997 | Keefe et al. | 324/244 |
| 5,773,974 | A * | 6/1998 | Kraz | 324/258 |
| 6,427,079 | B1 * | 7/2002 | Schneider et al. | 600/424 |
| 6,665,553 | B2 * | 12/2003 | Kandori et al. | 600/409 |
| 7,637,024 | B2 | 12/2009 | Amundson et al. | |
| 2006/0267833 | A1 * | 11/2006 | Langford et al. | 342/174 |

FOREIGN PATENT DOCUMENTS

| | | |
|---|---|---|
| JP | 10-022905 A | 1/1998 |
| JP | 2001-023076 A | 1/2001 |
| KR | 10-2002-0043368 A | 6/2002 |
| KR | 10-0496160 B1 | 6/2005 |
| KR | 10-2006-0050321 A | 5/2006 |
| KR | 10-0990670 B1 | 10/2010 |

\* cited by examiner

*Primary Examiner* — Vinh Nguyen
*Assistant Examiner* — Temilade S Rhodes-Vivour
(74) *Attorney, Agent, or Firm* — NSIP Law

(57) ABSTRACT

Provided are a method and apparatus for measuring a location of a terminal using a magnetic field. For example, the apparatus may measure a location of a terminal using a magnetic field obtained by a magnetic field sensor and one or more sensor values obtained by a plurality of other sensors.

29 Claims, 12 Drawing Sheets

- WALL
- GREATER THAN 0.4 GAUSS
- 0.33-0.44 GAUSS
- 0.27-0.33 GAUSS
- 0.2-0.27 GAUSS
- LESS THAN 0.2 GAUSS
- NOT EXPLORED

METHOD AND APPARATUS FOR MEASURING A LOCATION OF A TERMINAL USING MAGNETIC FIELD

CROSS-REFERENCE TO RELATED APPLICATION(S)

This application claims the benefit under 35 USC §119(a) of Korean Patent Application No. 10-2011-0088796, filed on Sep. 2, 2011, in the Korean Intellectual Property Office, the entire disclosure of which is incorporated herein by reference for all purposes.

BACKGROUND

1. Field

The following description relates to a method and apparatus for measuring a location of a terminal based on magnetic field.

2. Description of Related Art

Methods for measuring a location of a terminal in an indoor environment include, for example, a scheme using a wireless local area network (LAN) signal or a wireless fidelity (Wi-Fi) signal, a scheme using an ultrasonic signal, a scheme using an ultra-wideband (UWB) signal, and the like. However, these schemes have numerous drawbacks.

For example, the scheme using the wireless LAN or Wi-Fi signal has an extremely low accuracy, and the scheme using the ultrasonic signal and the UWB signal incur high costs due to the indoor infrastructure.

Another drawback of related technologies is the inability to decipher which floor a terminal is located within a building including a plurality of floors. That is, a terminal may move from one floor to another floor in the same building as a user moves. However, an accurate location on different floors may not be identified by current technologies.

Accordingly, there is a desire for a method and apparatus that may accurately measure a location of a terminal without an additional infrastructure.

SUMMARY

In one aspect, there is provided a method of measuring a location of a terminal using a magnetic field, the method including receiving a magnetic field map of an area at which the terminal is located, receiving values sensed by a first sensor and a second sensor which are included in the terminal and which sense a first information and a second information, respectively, and measuring a location of the terminal based on the magnetic field map, the first information sensed by the first sensor, and the second information sensed by the second sensor.

The first sensor may correspond to a magnetic field sensor that senses magnetic field information, and the second sensor may correspond to one of an acceleration sensor, an inertial sensor, a gyro sensor, a pressure sensor, and an ultrasonic sensor which sense acceleration information, inertia information, velocity information, pressure information, and ultrasonic information, respectively.

The measuring may comprise processing the first information sensed by the first sensor and the second information sensed by the second sensor, and measuring the location of the terminal by matching a result of the processing to the magnetic field map.

The processing may comprise combining the first information sensed by the first sensor and the second information sensed by the second sensor, and separating at least two elements associated with the location of the terminal, from a result of the combining.

The at least two elements may comprise a vertical element and a horizontal element of a magnetic field associated with the location of the terminal.

The measuring may comprise identifying a pattern of the first information sensed by the first sensor and a pattern of the second information sensed by the second sensor, and measuring the location of the terminal by matching the identified patterns of the first information and the second information to the magnetic field map.

The measuring may comprise correcting the first information sensed by the first sensor based on the second information sensed by the second sensor, and measuring the location of the terminal by matching a result of the corrected first information to the magnetic field map.

The measuring may further comprise measuring a direction in which the terminal moves based on the magnetic field map, the first information sensed by the first sensor, and the second information sensed by the second sensor.

The magnetic field map may comprise information about a magnetic field of a region including the area at which the terminal is located, a building included in the region, and a section included in the building.

The magnetic field map may comprise coordinate information, and the coordinate information may be stored in a coordinate form based on a predetermined reference point, and magnetic field information may be stored at each pair of coordinates using an x element value, a y element value, and a z element value based on the predetermined reference point as a reference axis.

The magnetic field map may comprise coordinate information, and the coordinate information may be stored in a form of a location on a map illustrated using a picture, and magnetic field information at each location may be stored using a size of a magnetic field and a magnetic north direction.

The magnetic field map may comprise at least one of a size of a magnetic field, element values of the x, y and z axes, a magnetic north direction, a declination, a dip, variations in the magnetic field, and a Fourier transform value of the magnetic field, in relation to the area, the sector, the building, and the region.

The method may further comprise requesting the magnetic field map of the area at which the terminal is located.

The method may further comprise receiving a result of determining whether to use the second sensor.

In one aspect, there is provided a non-transitory computer-readable medium comprising a program for instructing a computer to perform the method.

In one aspect, there is provided an apparatus for measuring a location of a terminal using a magnetic field, the apparatus including a receiving module configured to receive a magnetic field map of an area at which the terminal is located, an obtaining module configured to receive values sensed by a first sensor and a second sensor which are included in the terminal and which sense a first information and a second information, respectively, and a measuring module configured to measure a location of the terminal based on the magnetic field map, the first information sensed by the first sensor, and the second information sensed by the second sensor.

The first sensor may correspond to a magnetic field sensor that senses magnetic field information, and the second sensor may correspond to one of an acceleration sensor, an inertial sensor, a gyro sensor, a pressure sensor, and an ultrasonic sensor which sense acceleration information, inertia information, velocity information, pressure information, and ultrasonic information, respectively.

The measuring module may comprise a processing unit configured to process the first information sensed by the first sensor and the second information sensed by the second sensor, and a first measuring unit configured to measure the location of the terminal by matching a result of the processing to the magnetic field map.

The processing unit may comprise a combining device configured to combine the first information sensed by the first sensor and the second information sensed by the second sensor, and a separating device configured to separate at least two elements associated with the location of the terminal, from a result of the combining.

The at least two elements may comprise a vertical element and a horizontal element of a magnetic field associated with the location of the terminal.

The measuring module may comprise an identifying unit configured to identify a pattern of the first information sensed by the first sensor and a pattern of the second information sensed by the second sensor, and a second measuring unit configured to measure the location of the terminal by matching the identified patterns of the first information and the second information to the magnetic field map.

The measuring module may comprise a correcting unit configured to correct the first information sensed by the first sensor based on the second information sensed by the second sensor, and a third measuring unit configured to measure the location of the terminal by matching a result of the corrected first information to the magnetic field map.

The measuring module may further comprise a direction measuring unit configured to measure a direction in which the terminal moves based on the magnetic field map, the first information sensed by the first sensor, and the second information sensed by the second sensor.

The magnetic field map may comprise information about a magnetic field of a region including the area at which the terminal is located, a building included in the region, and a section included in the building.

The magnetic field map may comprise coordinate information, and the coordinate information may be stored in a coordinate form based on a predetermined reference point, and magnetic field information may be stored at each pair of coordinates using an x element value, a y element value, and a z element value based on the predetermined reference point as a reference axis.

The magnetic field map may comprise coordinate information, and the coordinate information may be stored in a form of a location on a map illustrated using a picture, and magnetic field information at each location may be stored using a size of a magnetic field and a magnetic north direction.

The magnetic field map may comprise at least one of a size of a magnetic field, element values of the x, y and z axes, a magnetic north direction, a declination, a dip, variations in the magnetic field, and a Fourier transform value of the magnetic field, in relation to the area, the sector, the building, and the region.

The apparatus may further comprise a requesting unit configured to request the magnetic field map of the area in which the terminal is located.

The receiving module may be further configured to receive a result of determining whether to use the second sensor.

Other features and aspects will be apparent from the following detailed description, the drawings, and the claims.

Figure 1:
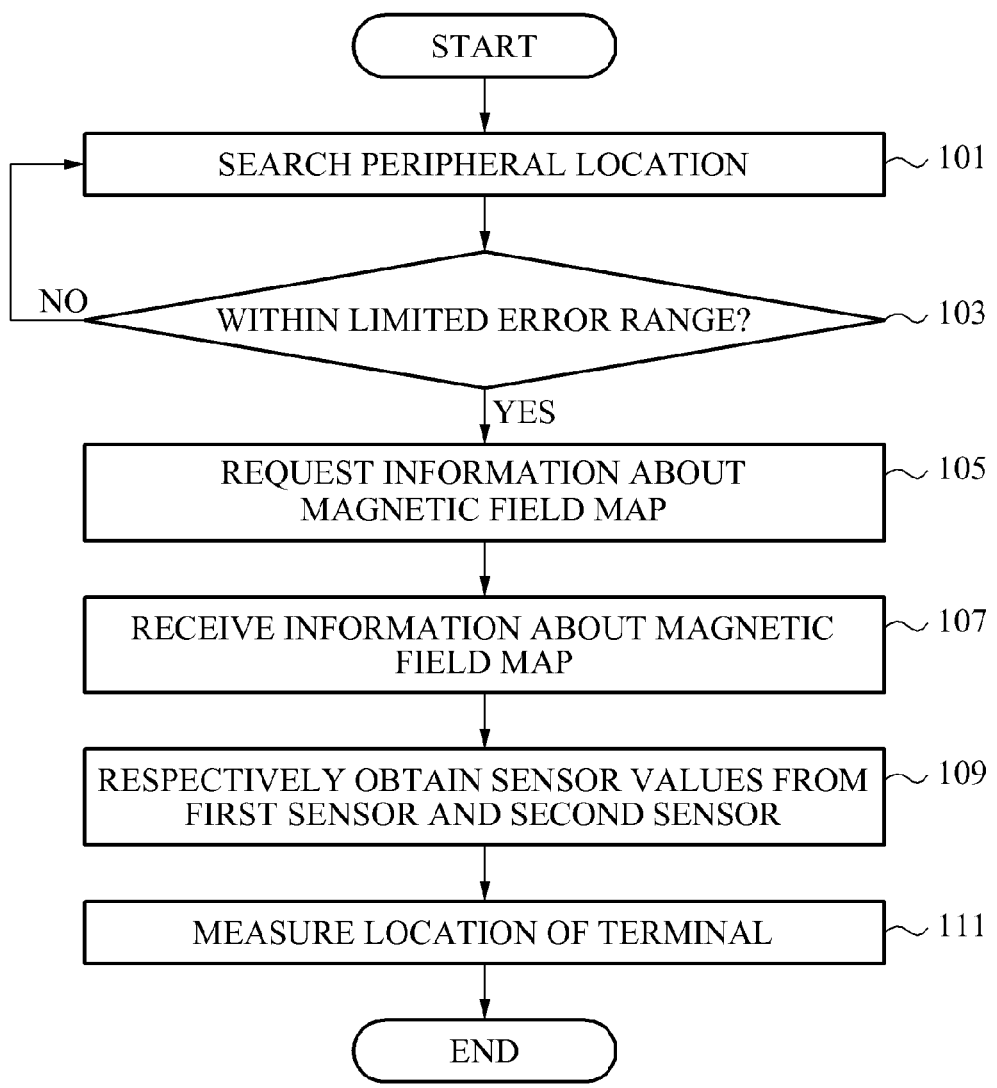
FIG. 1 is a flowchart illustrating an example of a method of measuring a location of a terminal based on magnetic field.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, description of well-known functions and constructions may be omitted for increased clarity and conciseness.

FIG. 1 illustrates an example of a method of measuring a location of a terminal based on magnetic field.

Referring to FIG. 1, an apparatus for measuring a location of a terminal based on magnetic field will be hereinafter referred to as a 'location measuring apparatus.' The apparatus searches a peripheral location of an area in which the terminal is located in 101. The location measuring apparatus may be or may be included in a terminal, for example, a mobile phone, a computer, a tablet, an appliance, a server, a navigation system, and the like. The location measuring apparatus determines whether a location of the corresponding area is within a limited error range in 103.

For example, if the location of the corresponding area is determined to be within the limited error range, the location measuring apparatus requests a magnetic field map of the area in which the terminal is located, in 105. The location measuring apparatus may request information from a magnetic field map storing unit. For example, the magnetic field map may include information such as a name, an address, a range of latitude or longitude, and the like, in relation to a section including the area where the terminal is located. Here, the magnetic field map storing unit may store the magnetic field map. As an example, the location measuring apparatus may request the magnetic field map in a form of #OO-XX, YY Building, ZZ section, and the like. The location measuring apparatus may also request the magnetic field map using various schemes of indicating the area in which the terminal is located in the magnetic field map.

If it is determined that the location of the corresponding area is out of the limited error range in 103, the location measuring apparatus returns to 101 and may search the peripheral location.

In response to the request in 105, the location measuring apparatus receives the magnetic field map of the area in which the terminal is located from a storing unit, in 107. For example, a magnetic field map storing unit may be included in the location measuring apparatus, included in a terminal including the location measuring apparatus, included in an external device, and the like. If the magnetic field map storing unit is disposed outside the terminal, the location measuring apparatus may receive information stored in the magnetic field map storing unit through a wireless, communication of the terminal, for example, cellular communication, wireless fidelity (Wi-Fi), or other communication functions. Examples of the magnetic field map storing unit and the information included in the magnetic field map that is stored in the magnetic field map storing unit are described with reference to FIGS. 7 and 8.

The location measuring apparatus obtains sensor values from at least a first sensor and a second sensor, respectively, which are included in the terminal and which sense different features than each other, in 109. For example, the first sensor may correspond to a magnetic field sensor, and the second sensor may correspond to an acceleration sensor, an inertial sensor, a gyro sensor, a pressure sensor, an ultrasonic sensor, and the like. In this example, the sensor value obtained from the first sensor may correspond to magnetic field information, and the sensor value obtained from the second sensor may correspond to one of acceleration information, inertial information, gyro sensor information, pressure information, ultrasonic information, and the like. It should also be appreciated that more than two sensors may be used, and more than two sensor values may be obtained.

The location measuring apparatus measures the location of the terminal using the magnetic field map and the sensor values obtained from the first sensor and the second sensor, respectively, in 111. For example, the location measuring apparatus may process the sensor value obtained from the first sensor and the sensor value obtained from the second sensor or may identify a pattern of the sensor value obtained from the first sensor, and a pattern of the sensor value obtained from the second sensor. The location measuring apparatus may measure the location of the terminal by matching a result of the processing or a result of the identifying to the magnetic field map. Examples of measuring the location of the terminal performed by the location measuring apparatus are described with reference to FIGS. 3 through 5.

It should also be appreciated that the location measuring apparatus may measure the location of the terminal using values obtained from more than two sensors.

Figure 2:
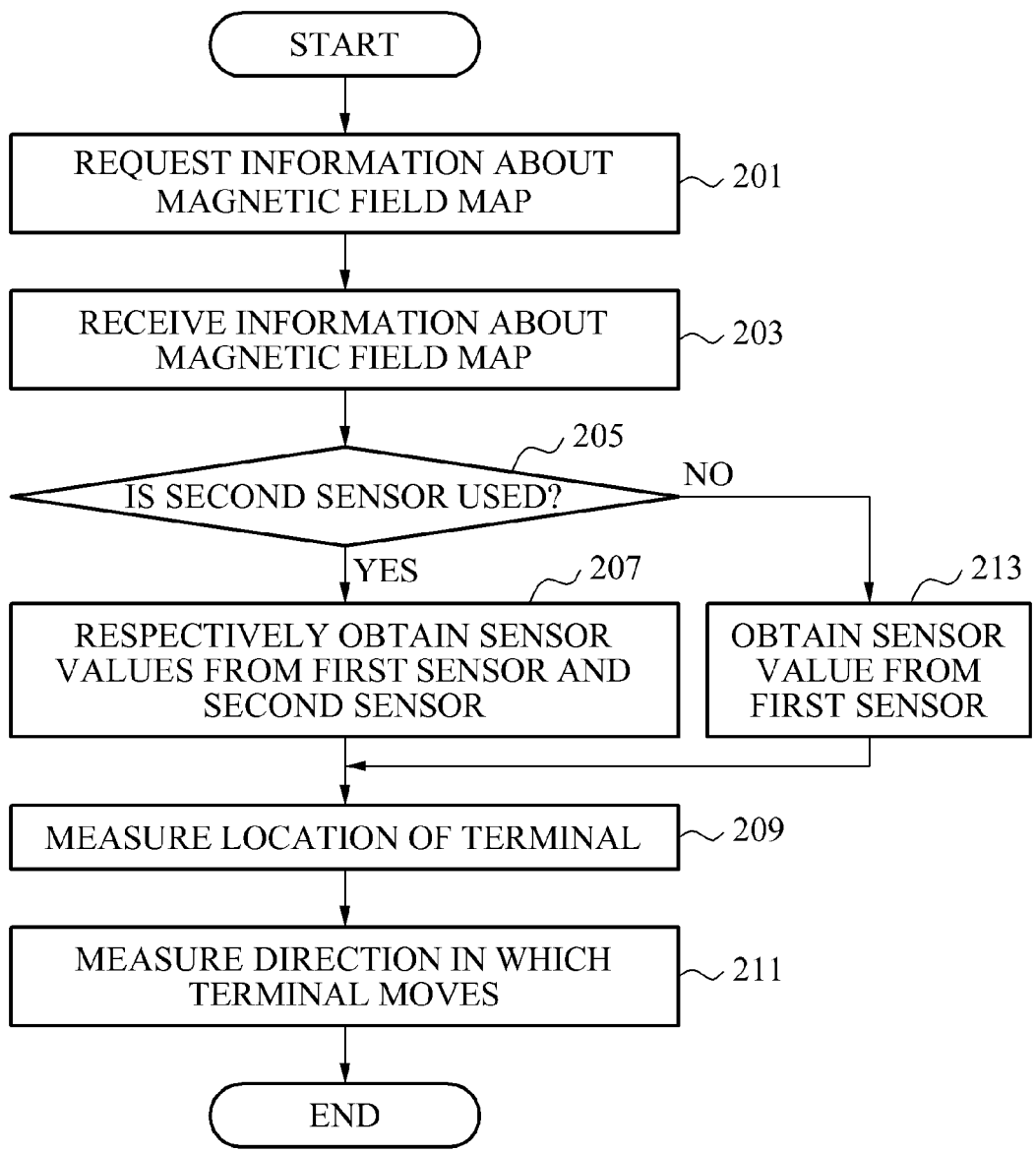
FIG. 2 is a flowchart illustrating another example of a method of measuring a location of a terminal based on magnetic field.

FIG. 2 illustrates another example of a method of measuring a location of a terminal based on magnetic field.

Referring to FIG. 2, in 201, the location measuring apparatus requests a magnetic field map of an area in which the terminal is located. For example, the information may be requested from a magnetic field map storing unit or other devices storing the information included in the magnetic field map.

In 203, the location measuring apparatus receives the magnetic field map of the area in which the terminal is located. For example, the magnetic field map may include information about a magnetic field map of the corresponding area in which the terminal is located, a corresponding region including the corresponding area, a building included in the corresponding region, a section included in the building, and the like. For example, the magnetic field map may include at least one of a size of a magnetic field, element values of the x, y and z axes, a magnetic north direction, a declination, a dip, variations in the magnetic field, a Fourier transform value of the magnetic field, in relation to each of the corresponding area, the corresponding region, the building, the sector, and the like.

In 205, the location measuring apparatus receives an input indicating whether to use the second sensor. For example, the input may be received from a user of a terminal that includes the location measuring apparatus. In this example, the location measuring apparatus may ask the user whether to use the second sensor, may receive an input of a result of determining whether to use the second sensor through ON and OFF settings of a switch or separate mode settings, and the like.

If the second sensor is to be used in 205, the location measuring apparatus obtains sensor values from a first sensor and a second sensor, respectively, which are included in the terminal and which sense different features than each other, in 207.

In 209, the location measuring apparatus measures the location of the terminal using the magnetic field map and the sensor values obtained from the first sensor and the second sensor. In 211, the location measurement apparatus measures a direction in which the terminal moves based on the magnetic field map and the sensor values obtained from the first sensor and the second sensor.

If it is determined not to use the second sensor in 205, the location measuring apparatus obtains a sensor value from the first sensor only, excluding the second sensor, in 213. In this example, in 209, the location measuring apparatus may measure the location of the terminal using the magnetic field map, and the sensor value, that is, magnetic field information obtained from the first sensor. In 211, the location measurement unit may measure a direction in which the terminal moves, using the magnetic field map and the sensor value, that is, magnetic field information obtained from the first sensor.

Figure 3:
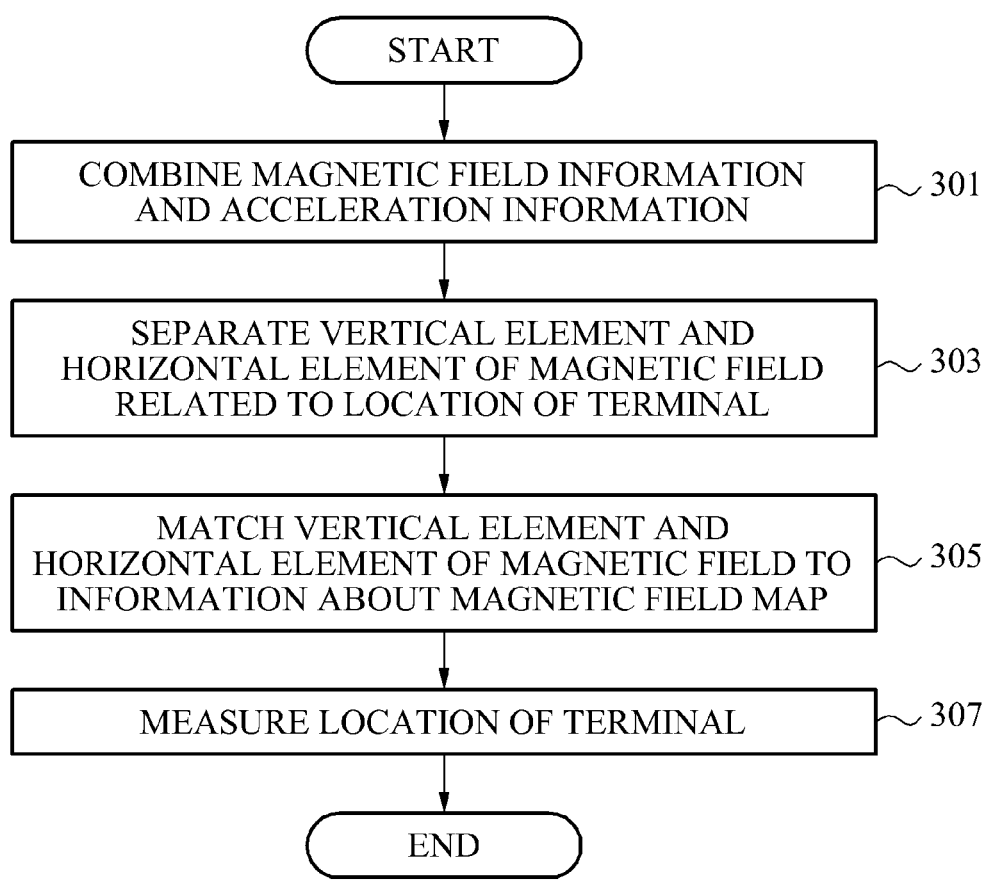
FIG. 3 is a flowchart illustrating an example of measuring a location of a terminal.

FIG. 3 illustrates an example of the measuring the location of the terminal. FIG. 3 illustrates a method of measuring the location of the terminal using a first sensor value which corresponds to a magnetic field sensor, and a second sensor which corresponds to an acceleration sensor.

For example, prior to measuring the location of the terminal, the location measuring apparatus may obtain sensor values from the first sensor and the second sensor, respectively, through 109 illustrated in FIG. 1. In this instance, the location measuring apparatus may obtain magnetic field information from the magnetic field sensor which may be expressed using a magnetic field vector m of Equation 1.

$$m=(m_x, m_y, m_z),\qquad\text{[Equation 1]}$$

where $m_x$, $m_y$, and $m_z$ denote an x element value, a y element value, and a z element value of the magnetic field respectively, for a vector m based on a reference point m as a reference axis.

In addition, the location measuring apparatus may obtain acceleration information from the acceleration sensor which may be expressed using a gravity vector g of Equation 2. In this example, the acceleration information may correspond to the gravity vector g measured by the acceleration sensor included in the terminal with respect to the terminal in a static state.

$$g=(g_x, g_y, g_z), |g|=1,\qquad\text{[Equation 2]}$$

where $g_x$, $g_y$, and $g_z$ denote an x element value, a y element value, and a z element value, respectively, of the gravity vector g, and |g|=1 denotes a norm value of $g_x$, $g_y$, and $g_z$. In Equation 2, |g|=1 indicates that a size of the gravity vector g constantly corresponds to a value of 1. The acceleration information of Equation 2 may be corrected more accurately by adding a sensor value obtained from a gyro sensor, that is, gyro sensor information, to the sensor value obtained from the acceleration sensor.

Referring to FIG. 3, the location measuring apparatus combines the magnetic information and the acceleration information in 301, and separates at least two different elements related to the location of the terminal, from a result of the combining, in 303. For example, the at least two elements may correspond to a vertical element and a horizontal element of a magnetic field associated with the location of the terminal. In this instance, the location measuring apparatus may compute a magnetic field element $m_{perp}$ in a direction that is vertical to the ground and a magnetic field element $m_{parr}$ in a direction that is horizontal, that is, parallel to the ground, based on the combined magnetic field information. For example, the magnetic field vector m and the acceleration information gravity vector g may be used to separate the magnetic field element $m_{perp}$ and the magnetic field element $m_{parr}$. The foregoing may be expressed by Equation 3.

$$m_{perp} = m \cdot g$$

$$m_{parr} = |m - m_{perp} \cdot g| \quad \text{[Equation 3]}$$

In Equation 3, the magnetic field element $m_{perp}$ in the direction vertical to the ground may correspond to a vertical element of the magnetic field associated with the location of the terminal, and the magnetic field element $m_{parr}$ in the direction horizontal, that is, parallel, to the ground may correspond to a horizontal element of the magnetic field associated with the location of the terminal. It should be appreciated that the location measuring apparatus may separate the magnetic element based on any plane, aside from the ground.

The location measuring apparatus measures the location of the terminal in 307, by matching the vertical element and horizontal element which are separated in 303, of the magnetic field associated with the location of the terminal matched to the magnetic field map in 305. For example, a direction of the measured magnetic field may be converted to be compliant with the magnetic field map when it is possible to reuse the location of the terminal and the direction in which the terminal moves measured through the aforementioned process.

Figure 4:
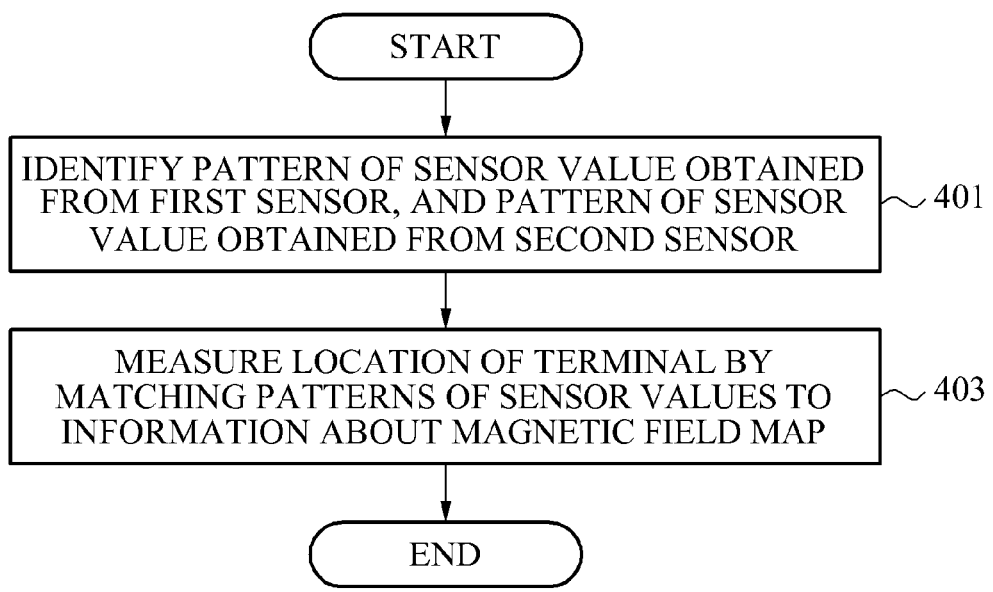
FIG. 4 is a flowchart illustrating another example of measuring a location of a terminal.

FIG. 4 illustrates another example of measuring the location of the terminal.

Referring to FIG. 4, the location measuring apparatus identifies a pattern of a sensor value obtained from a first sensor, and a pattern of a sensor value obtained from a second sensor in 401. The apparatus measures the location of the terminal by matching the identified patterns of the sensor values to the information of the magnetic field map in 403.

Figure 6:
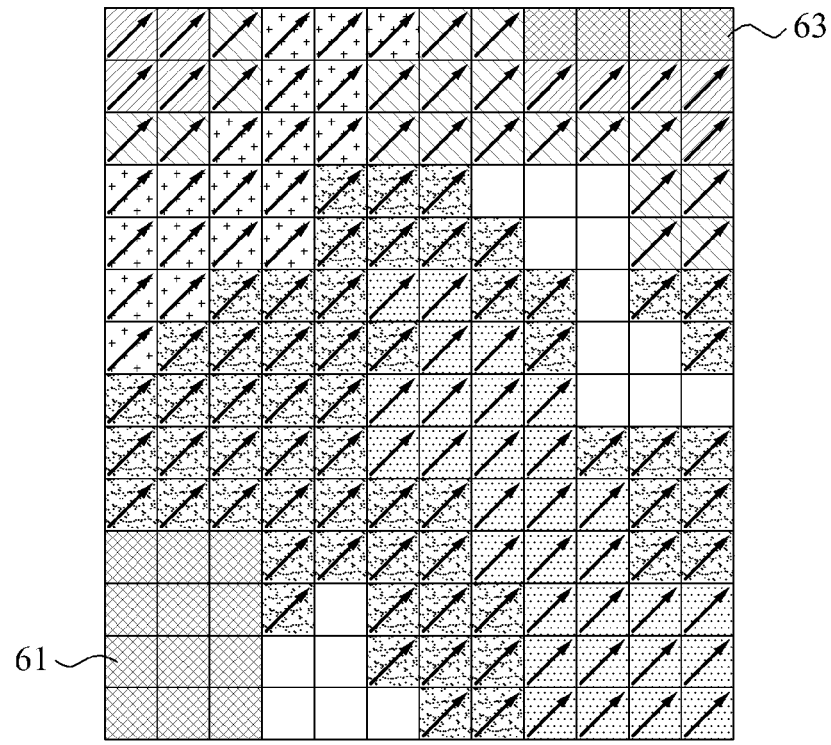
FIG. 6 is a diagram illustrating an example of a magnetic field map.

For example, magnetic field information obtained from a magnetic field sensor, that is, the first sensor, may have a pattern of an irregular wave, and acceleration information obtained from an acceleration sensor, that is, the second sensor, may have a pattern of an arrow with a gradient. In this example, the location measuring apparatus may match the pattern of the sensor value obtained from the magnetic field sensor, that is, the pattern of an irregular wave, and the pattern of the sensor value obtained from the acceleration sensor, that is, the pattern of an arrow with a gradient, to the magnetic field map. An example of a magnetic field map is illustrated in FIG. 6.

The location measuring apparatus may measure the location of the terminal based on a location, coordinates, and the like of a part or a point corresponding to the pattern of each sensor value in the magnetic field map. Generally, a size of a magnetic field at one point is not unique. Accordingly, the location of the terminal may be measured or estimated by identifying patterns in which the magnetic field information or the other sensor values change, as illustrated in FIG. 4.

Figure 5:
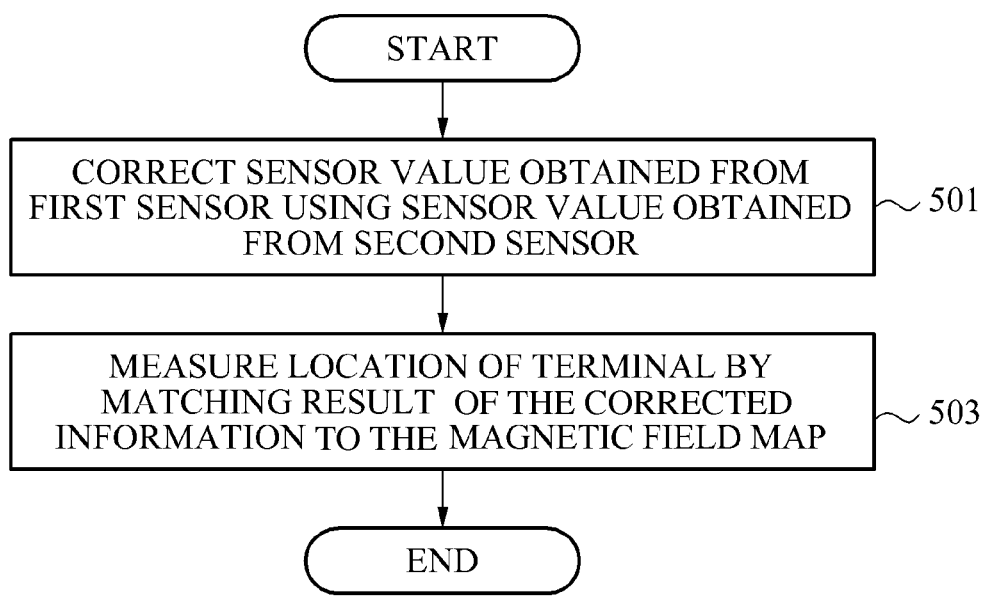
FIG. 5 is a flowchart illustrating another example of measuring a location of a terminal.

FIG. 5 illustrates another example of measuring the location of the terminal.

Referring to FIG. 5, the location measuring apparatus corrects a sensor value obtained from a first sensor using a sensor value obtained from a second sensor in 501. The apparatus measures the location of the terminal by matching a result of the correcting to the information of the magnetic field map in 503. For example, the first sensor may correspond to a magnetic field sensor, and the second sensor may correspond to an inertial sensor or an ultrasonic sensor. In this example, the location measuring apparatus may correct magnetic field information obtained from the magnetic field sensor using inertial information or ultrasonic information obtained from the inertial sensor or the ultrasonic sensor. The location measuring apparatus may measure the location of the terminal by matching a result of the corrected magnetic field information to elements included in the magnetic field map, for example, a size of a magnetic field, element values of three axes x, y and z, a magnetic north direction, a declination, a dip, variations in the magnetic field, a Fourier transform value of the magnetic field, and the like.

As another example, the location measuring apparatus may correct the sensor value that is obtained from the second sensor using a sensor value obtained from a third sensor included in the terminal, and may also re-correct the sensor value obtained from the first sensor using a result of the correcting. In this example, the third sensor may measure a different feature than the first sensor and the second sensor, and may correspond to one of an acceleration sensor, an inertial sensor, a gyro sensor, a pressure sensor, and an ultrasonic sensor. The location measuring apparatus may correct a value that is obtained from the first sensor or the second sensor using a measurement value of a cellular communication signal, a Wi-Fi signal, an ultra-wideband (UWB) signal, and the like.

The examples described with reference to FIGS. 3 through 5 may be applicable to step 111 of FIG. 1 and to 209 of FIG. 2.

FIG. 6 illustrates an example of a magnetic field map.

FIG. 6 illustrates an example of a magnetic field map of an indoor space that includes walls 61 and 63. In various examples, the magnetic field map may include a plurality of cells and/or grids. Here, an arrow in each cell is used to indicate a magnetic north direction. For example, the intensity of the arrow may indicate a size of the magnetic field.

The magnetic field map may include additional information, for example, a size of a magnetic field, element values of three axes x, y and z, a magnetic north direction, a declination, a dip, variations in the magnetic field, a Fourier transform value of the magnetic field, and the like, in relation to each of a region including an area in which the terminal is located, a building included in the corresponding region, and a section included in the corresponding building.

Figure 7:
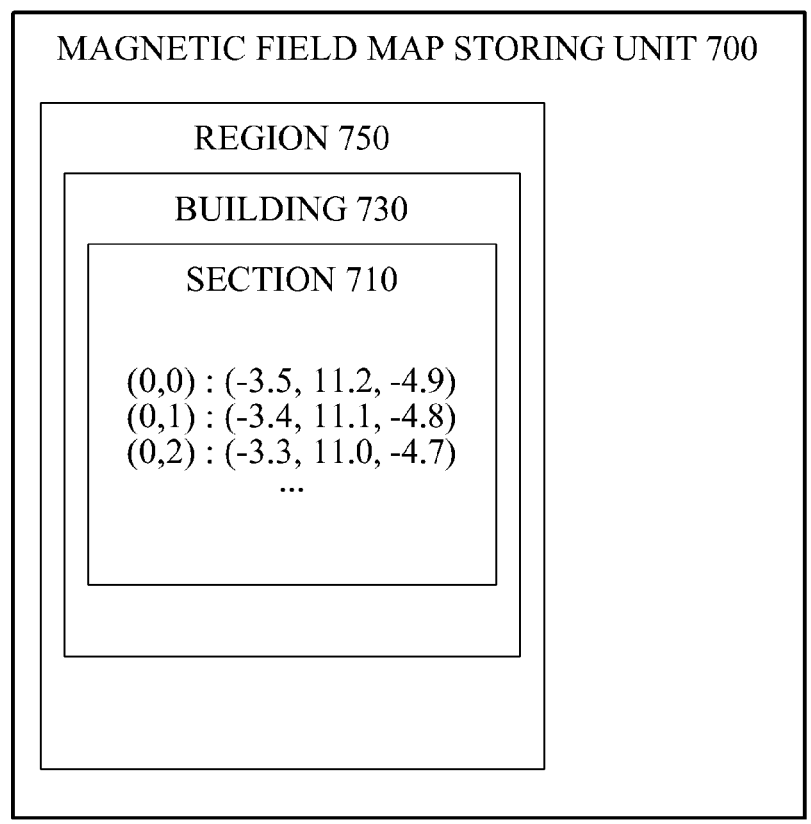
FIG. 7 is a diagram illustrating an example of a magnetic field map storing unit.

FIG. 7 illustrates an example of a magnetic field map storing unit.

Referring to FIG. 7, magnetic field map storing unit 700 may hierarchically store information included in a magnetic field map, for example, information about a magnetic field map of region 750 which includes an area in which a terminal is located, a building 730 included in the corresponding region 750, and a section 710 included in the corresponding building 730.

In FIG. 7, the magnetic field map may include coordinate information about the magnetic field map. For example, the coordinate information may be stored in a coordinate form based on a predetermined reference point, and magnetic field information at each pair of coordinates may be stored using an x element value, a y element value, and a z element value based on the predetermined reference point as a reference axis. For example, if the coordinate information based on the predetermined reference point corresponds to (0, 1), magnetic field information at coordinates (0, 1) may be stored to be element values (−3.4, 11.1, −4.8) in x, y, and z directions based on the predetermined reference point as a reference axis.

Figure 8:
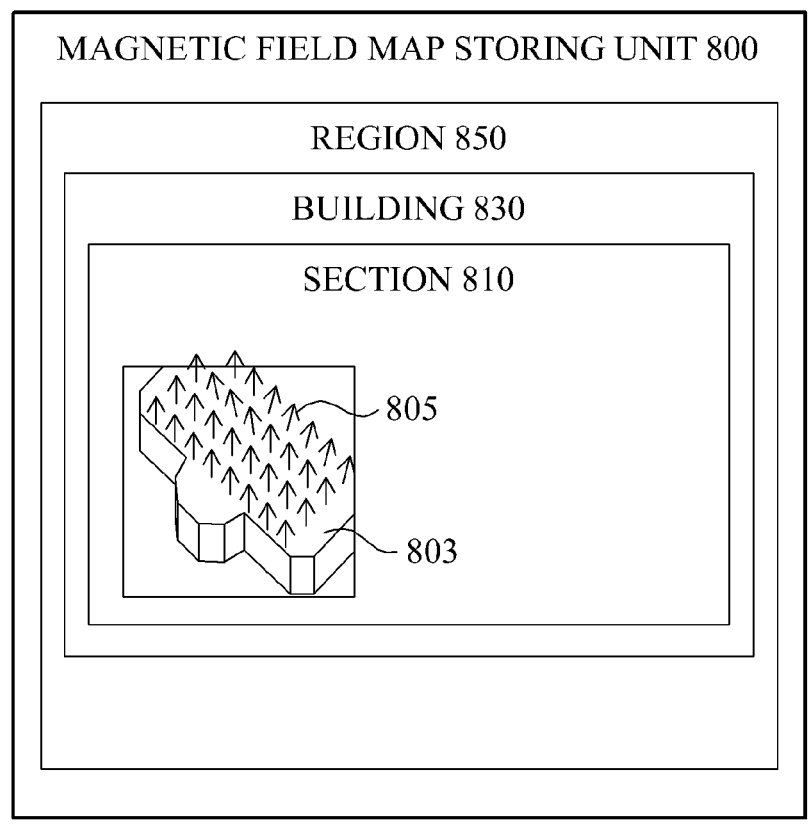
FIG. 8 is a diagram illustrating another example of a magnetic field map storing unit.

FIG. 8 illustrates another example of a magnetic field map storing unit.

Similar to FIG. 7, magnetic field map storing unit 800 may hierarchically store information included in a magnetic field map, for example, information about a magnetic field map of a region 850 which includes an area in which a terminal is located, a building 830 included in the corresponding region 850, and a section 810 included in the corresponding building 830.

In FIG. 8, the magnetic field map may include coordinate information about the magnetic field map. For example, the coordinate information may be stored in a form of a to location on a map 803 illustrated using a picture, as illustrated in FIG. 8, and magnetic field information at each location may be stored using a size of a magnetic field and a magnetic north direction. In FIG. 8, the intensity of an arrow 805 may be used to illustrate the size of the magnetic field, and a grade of the arrow 805 may indicate the magnetic north direction.

In addition to the examples illustrated with reference to FIGS. 7 and 8, the magnetic field map may be stored using various schemes, such as a list structure, a hash structure, a cache structure of first storing based on a frequency of usage, and the like. The magnetic field map may include various types of magnetic field information, for example, a size of a magnetic field, element values of one or more of the x, y, and z axes, a magnetic north direction, a declination, a dip, variations in the magnetic field, a Fourier transform value of the magnetic field, and the like.

Figure 9:
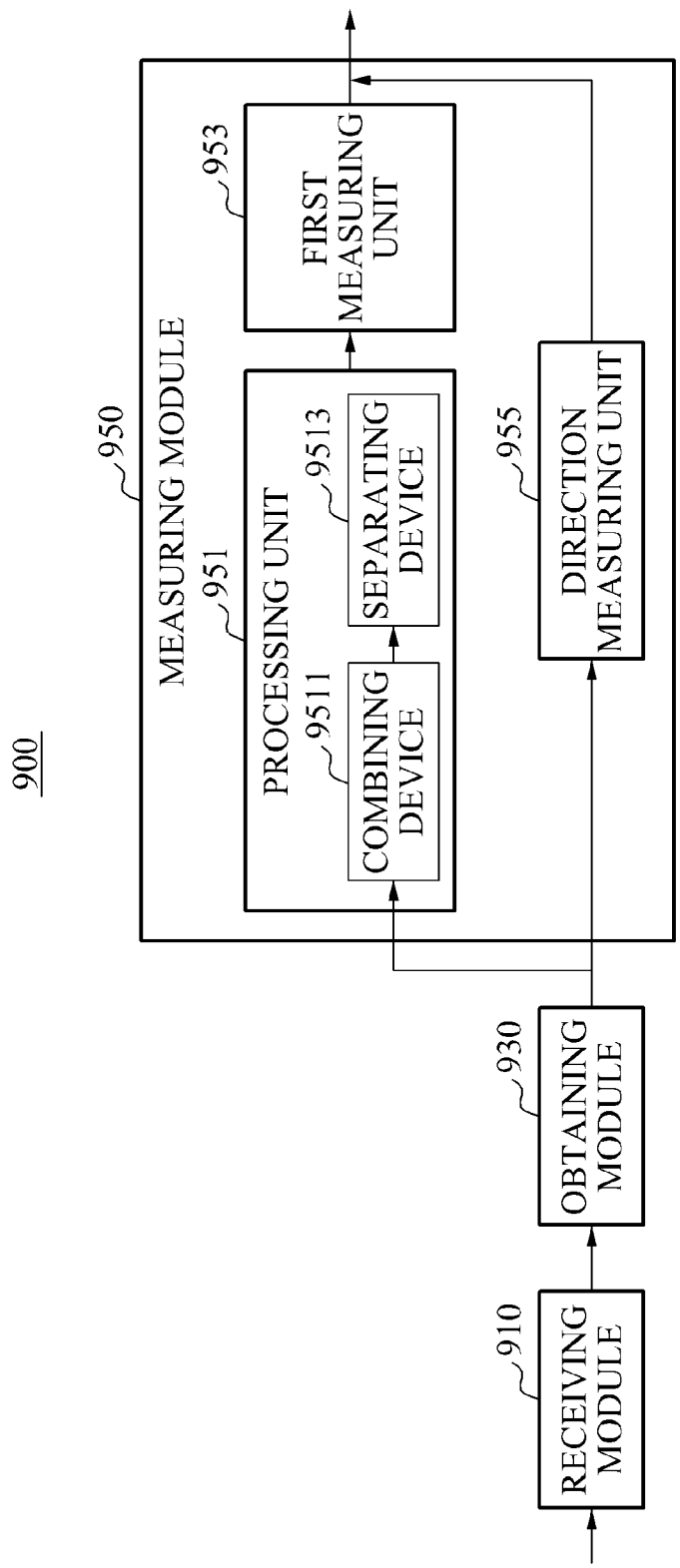
FIG. 9 is a diagram illustrating an example of an apparatus for measuring a location of a terminal based on magnetic field.

FIG. 9 illustrates an example of an apparatus for measuring a location of a terminal based on magnetic field.

Referring to FIG. 9, location measuring apparatus 900 includes a receiving module 910, an obtaining module 930, and a measuring module 950.

The receiving module 910 may receive a magnetic field map of an area in which the terminal in located. For example, the receiving module 910 may receive the magnetic field map of the area in which the terminal is located from the magnetic field map storing unit 700 or 800 described in the examples with reference to FIG. 7 or FIG. 8. The magnetic field map storing unit 700 or 800 may be disposed within or outside of a terminal including the location measuring apparatus.

The obtaining unit 930 may obtain sensor values from a first sensor and a second sensor, respectively, which are included in the terminal and which sense different features than each other. For example, the first sensor may correspond to a magnetic field sensor, and the second sensor may correspond to one of an acceleration sensor, an inertial sensor, a gyro sensor, a pressure sensor, and an ultrasonic sensor.

The measuring module 950 may measure the location of the terminal using the magnetic field map and the sensor values obtained from the first sensor and the second sensor, respectively. In the example of FIG. 9, the measuring module 950 includes a processing unit 951 that may process the sensor values obtained from the first sensor and the second sensor, and a first measuring unit 953 that may measure the location of the terminal by matching a result of the processing performed by the processing unit 951 to the magnetic field map.

The processing unit 951 includes a combining device 9511 and a separating device 9513. For example, the combining device 9511 may combine the sensor value obtained from the first sensor and the sensor value obtained from the second sensor. The separating device 9513 may separate at least two different elements associated with the location of the terminal, from a result of the combining performed by the combining device 9511. As an example, the at least two elements may correspond to a vertical element of a magnetic field associated with the location of the terminal, that is, a magnetic field element in a direction vertical to the ground, and a horizontal element of the magnetic field associated with the location of the terminal, that is, a magnetic field element in a direction horizontal, that is, parallel to the ground.

The measuring module 950 further includes a direction measuring unit 955 that may measure a direction in which the terminal moves, based on the information included in the magnetic field map and the sensor values obtained from the first sensor and the second sensor, respectively.

In some examples, the measuring module 950 may further include an identifying unit (now shown) and a second measuring unit (not shown). The identifying unit may identify a pattern of the sensor value obtained from the first sensor, and a pattern of the sensor value obtained from the second sensor. In this example, the second measuring unit may measure the location of the terminal by matching the identified patterns of the sensor values to the magnetic field map.

In addition, the measuring module 950 may further include a correcting unit (not shown) and a third measuring unit (not shown). The correcting unit may correct the sensor value obtained from the first sensor, based on the sensor value obtained from the second sensor, and a third measuring unit may measure the location of the terminal by matching a result of the corrected sensor value to the magnetic field map.

Figure 10:
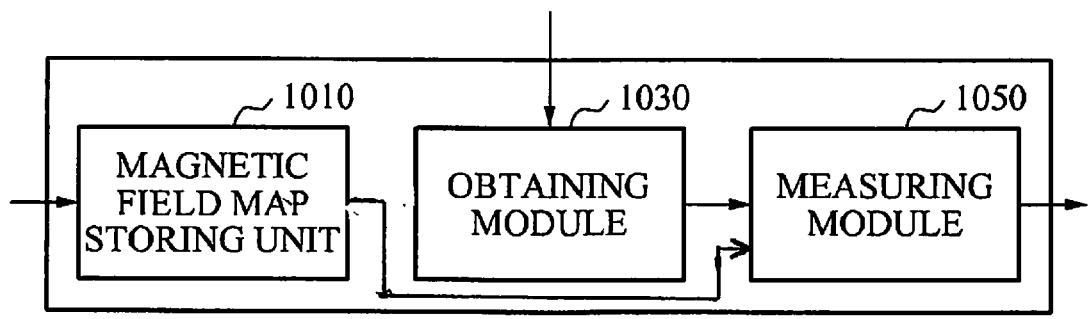
FIG. 10 is a diagram illustrating another example of an apparatus for measuring a location of a terminal based on magnetic field.

FIG. 10 illustrates another example of an apparatus for measuring a location of a terminal based on magnetic field.

Referring to FIG. 10, location measuring apparatus 1000 includes a magnetic field map storing unit 1010, an obtaining module 1030, and a measuring module 1050. In this example, the location measuring apparatus 1000 includes the magnetic field map storing unit 1010 instead of the receiving module 910 of FIG. 9.

The magnetic field map storing unit 1010 may store a magnetic field map of an area in which the terminal is located. The magnetic field map may include at least one of a size of a magnetic field, element values of x, y and z axes, a magnetic north direction, a declination, a dip, variations in the magnetic field, and a Fourier transform value of the magnetic field, in relation to the area, the sector, the building, the region, and the like.

For example, the magnetic field map storing unit 1010 may hierarchically store information about a magnetic field of a region including the area in which the terminal is located, a building included in the corresponding region, and a section included in the corresponding building. Additional examples of the magnetic field map storing unit 1010 are described with reference to FIGS. 7 and 8.

The obtaining module 1030 and the measuring module 1050 are similar to the obtaining module 930 and the measuring module 950 of FIG. 9. Additional description thereof is omitted herein for conciseness.

Figure 11:
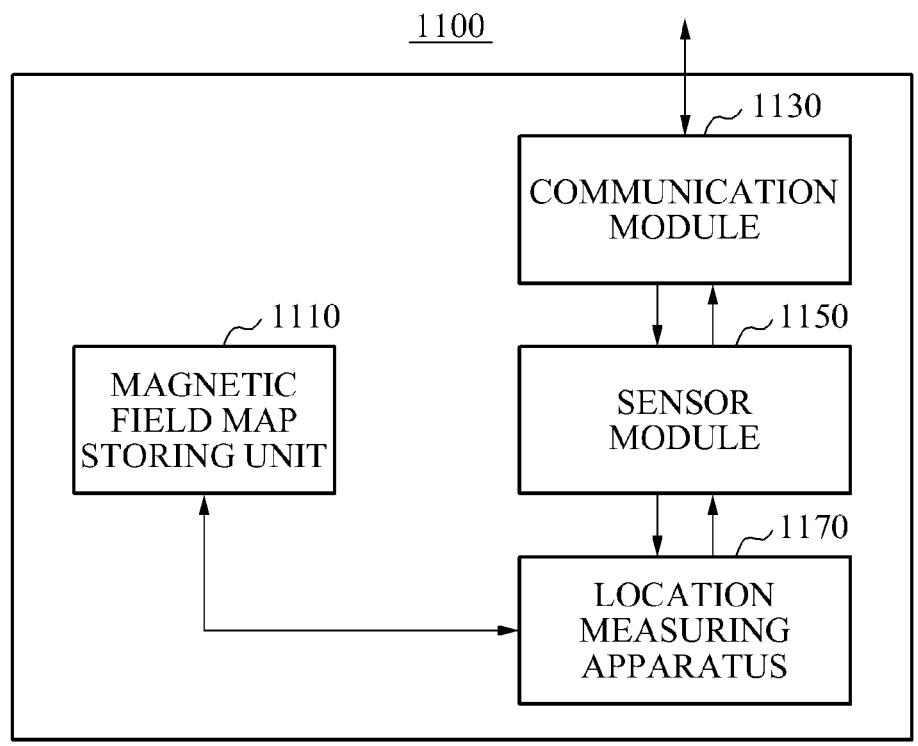
FIG. 11 is a diagram illustrating an example of a terminal including the location measuring apparatus of FIG. 9.

FIG. 11 illustrates an example of a terminal including the location measuring apparatus of FIG. 9.

Referring to FIG. 11, terminal 1100 includes a magnetic field map storing unit 1110, a communication module 1130, a sensor module 1150, and a location measuring apparatus 1170. In this example, the terminal 1100 includes the magnetic field map storing unit 1110 inside the terminal 1100, therefore, the terminal may not need to receive information about the magnetic field map through external communication. However, if an update to the information about the magnetic field map is performed, the terminal 1100 may receive updated information through the external communication. The magnetic field map storing unit 1110 may store the aforementioned magnetic field map.

The communication module 1130 may perform communication with other external devices. For example, the communication module 1130 may transmit and receive various types of data such as a sound, an image, and the like through various communication functions such as a local area communication, a proximity communication, and the like, for example, a UWB communication, a cellular communication, Wi-Fi, Bluetooth, and the like.

The sensor module 1150 may include a plurality of sensors, for example, a first sensor, a second sensor, and the like. The sensor module 1150 may include one or more of a magnetic field sensor, an acceleration sensor, an inertial sensor, a gyro sensor, a pressure sensor, an ultrasonic sensor, and the like.

The location measuring apparatus 1170 may measure the location of the terminal using the magnetic field as described in the examples with reference to FIGS. 1 through 10. Accordingly, the descriptions with reference to FIGS. 1 through 10 are omitted here for conciseness.

Figure 12:
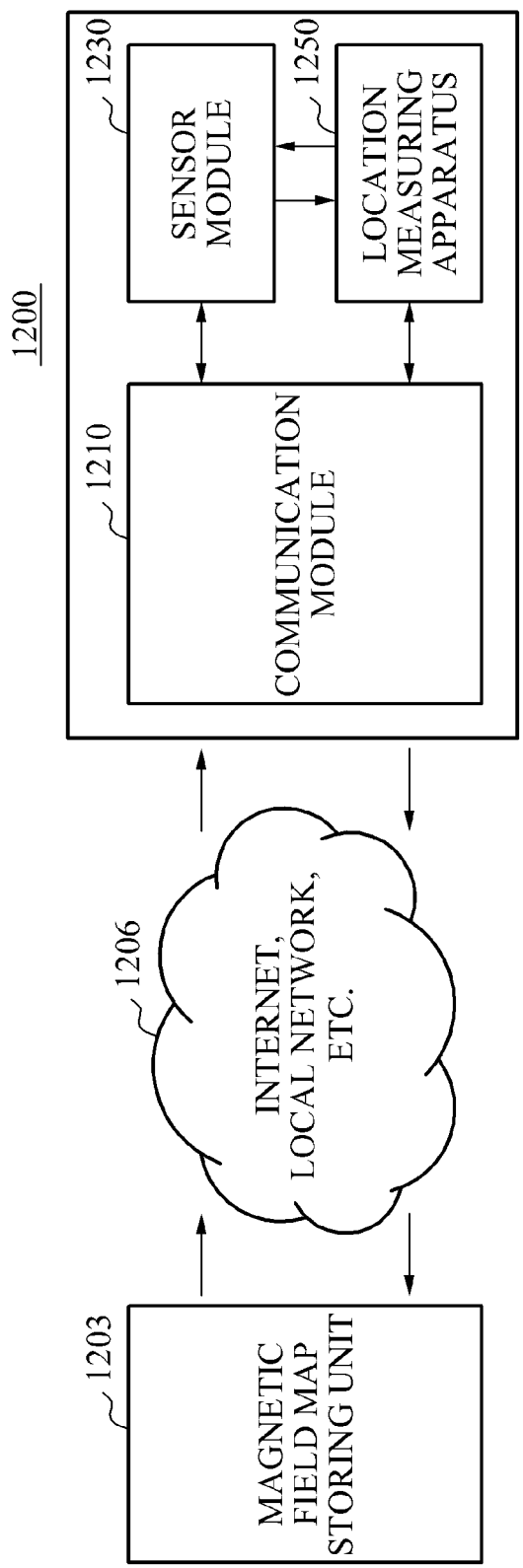
FIG. 12 is a diagram illustrating another example of a terminal including the location measuring apparatus of FIG. 9.

FIG. 12 illustrates another example of a terminal including the location measuring apparatus of FIG. 9.

Referring to FIG. 12, terminal 1200 includes a communication module 1210, a sensor module 1230, and a location measuring apparatus 1250. In FIG. 12, a magnetic field map storing unit is disposed outside the terminal 1200. Accordingly, the terminal 1200 may use the communication module 1210 to access the magnetic field map storing unit 1203 that is disposed outside the terminal 1200, through a communication network 1206. The terminal 1200 may receive a magnetic field map from the magnetic field map storing unit 1203 that is disposed outside the terminal 1200.

The magnetic field map storing unit 1203 may store the information included in the magnetic field map as aforementioned. The magnetic field map storing unit 1203 may include multiple sub-storing units. For example, the magnetic field map may be divided and stored in the multiple sub-storing units. Accordingly, the terminal 1200 may access a desired sub-storing unit among the multiple sub-storing units to request information included in a magnetic field map of a desired area or region, and may receive the corresponding information, that is, desired magnetic field information.

The communication network 1206 may include the Internet, a location network, a UWB wireless communication network, a proximity communication network, a cellular communication network, a location area communication network, and the like.

The descriptions of the communication module 1130, the sensor module 1150, and the location measuring apparatus 1170 of FIG. 11 can be referred to for descriptions of the communication module 1210, the sensor module 1230, and the location measuring apparatus 1250.

According to various aspects, a location of a terminal and a direction in which the terminal moves may be measured without an additional infrastructure, using sensors included in the terminal.

According to various aspects, information about surroundings of a terminal, and a more accurate location-based service (LBS) for a pedestrian navigation may be provided using sensor values obtained by a magnetic field sensor included in the terminal, and a plurality of other sensors.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable storage mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running.

As a non-exhaustive illustration only, a terminal/device/unit described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television to (HDTV), an optical disc player, a setup box, a home appliance, and the like that are capable of wireless communication or network communication consistent with that which is disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer. It will be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of measuring a location of a terminal using a magnetic field, the method comprising:
   receiving a magnetic field map of an area at which the terminal is located, wherein the magnetic field map includes a size of a magnetic field and a magnetic north direction;
   receiving values sensed by a first sensor and a second sensor which are included in the terminal and which sense a first information and a second information, respectively; and
   measuring a location of the terminal based on the magnetic field map, the first information sensed by the first sensor, and the second information sensed by the second sensor.

2. The method of claim 1, wherein
   the first sensor corresponds to a magnetic field sensor that senses magnetic field information, and
   the second sensor corresponds to one of an acceleration sensor, an inertial sensor, a gyro sensor, a pressure sensor, and an ultrasonic sensor which sense acceleration information, inertia information, velocity information, pressure information, and ultrasonic information, respectively.

3. The method of claim 1, wherein the measuring comprises:
   processing the first information sensed by the first sensor and the second information sensed by the second sensor; and
   measuring the location of the terminal by matching a result of the processing to the magnetic field map.

4. The method of claim 3, wherein the processing comprises:
   combining the first information sensed by the first sensor and the second information sensed by the second sensor; and
   separating at least two elements associated with the location of the terminal, from a result of the combining.

5. The method of claim 4, wherein the at least two elements comprise a vertical element and a horizontal element of a magnetic field associated with the location of the terminal.

6. The method of claim 1, wherein the measuring comprises:
   identifying a pattern of the first information sensed by the first sensor and a pattern of the second information sensed by the second sensor; and
   measuring the location of the terminal by matching the identified patterns of the first information and the second information to the magnetic field map.

7. The method of claim 1, wherein the measuring comprises:
   correcting the first information sensed by the first sensor based on the second information sensed by the second sensor; and
   measuring the location of the terminal by matching a result of the corrected first information to the magnetic field map.

8. The method of claim 1, wherein the measuring further comprises:
   measuring a direction in which the terminal moves based on the magnetic field map, the first information sensed by the first sensor, and the second information sensed by the second sensor.

9. The method of claim 1, wherein the magnetic field map comprises information about a magnetic field of a region including the area at which the terminal is located, a building included in the region, and a section included in the building.

10. The method of claim 9, wherein
    the magnetic field map comprises coordinate information, and
    the coordinate information is stored in a form of a location on a map illustrated using a picture, and magnetic field information at each location is stored using a size of a magnetic field and a magnetic north direction.

11. The method of claim 9, wherein the magnetic field map comprises at least one of a size of a magnetic field, element values of the x, y and z axes, a magnetic north direction, a declination, a dip, variations in the magnetic field, and a Fourier transform value of the magnetic field, in relation to the area, the sector, the building, and the region.

12. The method of claim 1, further comprising:
    requesting the magnetic field map of the area at which the terminal is located.

13. The method of claim 1, further comprising:
    receiving a result of determining whether to use the second sensor.

14. A non-transitory computer-readable medium comprising a program for instructing a computer to perform the method of claim 1.

15. An apparatus for measuring a location of a terminal using a magnetic field, the apparatus comprising:
    a receiving module configured to receive a magnetic field map of an area at which the terminal is located;
    an obtaining module configured to receive values sensed by a first sensor and a second sensor which are included in the terminal and which sense a first information and a second information, respectively; and
    a measuring module configured to measure a location of the terminal based on the magnetic field map received by the receiving module, the first information sensed by the first sensor received by the obtaining module, and the second information sensed by the second sensor received by the obtaining module.

16. The apparatus of claim 15,
    the first sensor corresponds to a magnetic field sensor that senses magnetic field information, and
    the second sensor corresponds to one of an acceleration sensor, an inertial sensor, a gyro sensor, a pressure sensor, and an ultrasonic sensor which sense acceleration information, inertia information, velocity information, pressure information, and ultrasonic information, respectively.

17. The apparatus of claim 15, wherein the measuring module comprises:
    a processing unit configured to process the first information sensed by the first sensor and the second information sensed by the second sensor; and a first measuring unit configured to measure the location of the terminal by matching a result of the processing to the magnetic field map.

18. The apparatus of claim 17, wherein the processing unit comprises:
a combining device configured to combine the first information sensed by the first sensor and the second information sensed by the second sensor; and
a separating device configured to separate at least two elements associated with the location of the terminal, from a result of the combining.

19. The apparatus of claim 18, wherein the at least two elements comprise a vertical element and a horizontal element of a magnetic field associated with the location of the terminal.

20. The apparatus of claim 15, wherein the measuring module comprises:
an identifying unit configured to identify a pattern of the first information sensed by the first sensor and a pattern of the second information sensed by the second sensor; and
a second measuring unit configured to measure the location of the terminal by matching the identified patterns of the first information and the second information to the magnetic field map.

21. The apparatus of claim 15, wherein the measuring module comprises:
a correcting unit configured to correct the first information sensed by the first sensor based on the second information sensed by the second sensor; and
a third measuring unit configured to measure the location of the terminal by matching a result of the corrected first information to the magnetic field map.

22. The apparatus of claim 15, wherein the measuring module further comprises:
a direction measuring unit configured to measure a direction in which the terminal moves based on the magnetic field map, the first information sensed by the first sensor, and the second information sensed by the second sensor.

23. The apparatus of claim 15, wherein the magnetic field map comprises information about a magnetic field of a region including the area at which the terminal is located, a building included in the region, and a section included in the building.

24. The apparatus of claim 23, wherein
the magnetic field map comprises coordinate information, and
the coordinate information is stored in a form of a location on a map illustrated using a picture, and magnetic field information at each location is stored using a size of a magnetic field and a magnetic north direction.

25. The apparatus of claim 23, wherein the magnetic field map comprises at least one of a size of a magnetic field, element values of the x, y and z axes, a magnetic north direction, a declination, a dip, variations in the magnetic field, and a Fourier transform value of the magnetic field, in relation to the area, the sector, the building, and the region.

26. The apparatus of claim 15, further comprising:
a requesting unit configured to request the magnetic field map of the area in which the terminal is located.

27. The apparatus of claim 15, the receiving module is further configured to receive a result of determining whether to use the second sensor.

28. The method of claim 5, wherein
the vertical element of the magnetic field comprises a magnetic field element in a direction vertical to the ground, and
the horizontal element of the magnetic field comprises a magnetic field element in a direction parallel to the ground.

29. The apparatus of claim 19, wherein
the vertical element of the magnetic field comprises a magnetic field element in a direction vertical to the ground, and
the horizontal element of the magnetic field comprises a magnetic field element in a direction parallel to the ground.

* * * * *